(12) United States Patent
Kouketsu et al.

(10) Patent No.: US 9,496,275 B2
(45) Date of Patent: Nov. 15, 2016

(54) SEMICONDUCTOR MEMORY DEVICE HAVING LOWERED BIT LINE RESISTANCE

(71) Applicant: Cypress Semiconductor Corporation, San Jose, CA (US)

(72) Inventors: Hiroaki Kouketsu, Fukushima-ken (JP); Masaya Hosaka, Fukushima-ken (JP)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 0 days.

(21) Appl. No.: 14/540,803

(22) Filed: Nov. 13, 2014

(65) Prior Publication Data

US 2015/0072497 A1 Mar. 12, 2015

Related U.S. Application Data

(60) Division of application No. 11/338,956, filed on Jan. 24, 2006, now Pat. No. 8,901,637, which is a continuation of application No. PCT/JP2005/000875, filed on Jan. 24, 2005.

(51) Int. Cl.
| | |
|---|---|
| *H01L 21/266* | (2006.01) |
| *H01L 21/28* | (2006.01) |
| *H01L 27/115* | (2006.01) |
| *H01L 29/792* | (2006.01) |

(Continued)

(52) U.S. Cl.
CPC ....... *H01L 27/11563* (2013.01); *H01L 21/266* (2013.01); *H01L 21/28282* (2013.01); *H01L 21/31111* (2013.01); *H01L 27/105* (2013.01); *H01L 27/11568* (2013.01); *H01L 27/11573* (2013.01); *H01L 29/45* (2013.01); *H01L 29/513* (2013.01); *H01L 29/518* (2013.01); *H01L 29/66833* (2013.01); *H01L 29/792* (2013.01)

(58) Field of Classification Search
CPC ........... H01L 27/11563; H01L 21/266; H01L 21/28282
See application file for complete search history.

(56) References Cited

U.S. PATENT DOCUMENTS

| | | |
|---|---|---|
| 5,284,784 A | 2/1994 | Manley |
| 6,177,340 B1 | 1/2001 | Yoo et al. |

(Continued)

FOREIGN PATENT DOCUMENTS

| | | |
|---|---|---|
| EP | 1365452 | 11/2003 |
| JP | 10189966 | 7/1998 |

(Continued)

OTHER PUBLICATIONS

International Search Report for International Application No. PCT/JP2005/000875 dated Jan. 24, 2005; 6 pages.

(Continued)

*Primary Examiner* — Allison P Bernstein
(74) *Attorney, Agent, or Firm* — Kunzler Law Group, PC

(57) ABSTRACT

A semiconductor device includes a semiconductor substrate, an ONO (oxide/nitride/oxide) film provided on the semiconductor substrate, a control gate provided on the ONO film, a first low-resistance layer, and a second low-resistance layer in contact with the first low-resistance layer, the second low-resistance layer having a sheet resistance lower than the first low-resistance layer. With this configuration, it is possible to downsize the memory cell and provide a fabrication method of the semiconductor device in which the peripheral circuit can be fabricated with simple fabrication processes.

10 Claims, 5 Drawing Sheets

(51) Int. Cl.
*H01L 27/105* (2006.01)
*H01L 21/311* (2006.01)
*H01L 29/45* (2006.01)
*H01L 29/51* (2006.01)
*H01L 29/66* (2006.01)

(56) References Cited

U.S. PATENT DOCUMENTS

| | | | |
|---|---|---|---|
| 6,188,115 B1 * | 2/2001 | Kamitani | H01L 27/11521 257/316 |
| 6,235,575 B1 * | 5/2001 | Kasai | H01L 21/28525 257/300 |
| 6,278,164 B1 | 8/2001 | Hieda et al. | |
| 6,458,642 B1 * | 10/2002 | Yeh | H01L 27/115 257/E21.679 |
| 6,465,306 B1 | 10/2002 | Ramsbey et al. | |
| 6,897,514 B2 | 5/2005 | Kouznetsov et al. | |
| 7,256,112 B2 | 8/2007 | Chong et al. | |
| 2002/0146885 A1 | 10/2002 | Chen | |
| 2003/0119314 A1 | 6/2003 | Ogura et al. | |
| 2003/0194841 A1 | 10/2003 | Inoue et al. | |
| 2004/0048433 A1 | 3/2004 | Takahashi | |
| 2005/0161701 A1 | 7/2005 | Tomiie et al. | |

FOREIGN PATENT DOCUMENTS

| | | |
|---|---|---|
| JP | 2000031436 | 1/2000 |
| JP | 2001118944 | 4/2001 |
| JP | 2002170891 | 6/2002 |
| JP | 200351558 | 2/2003 |
| JP | 2003258134 | 9/2003 |
| JP | 2003338566 | 11/2003 |
| JP | 200495904 | 3/2004 |

OTHER PUBLICATIONS

USPTO Final Rejection for U.S. Appl. No. 11/338,956 dated Jan. 10, 2014; 11 pages.
USPTO Final Rejection for U.S. Appl. No. 11/338,956 dated Mar. 25, 2011; 11 pages.
USPTO Final Rejection for U.S. Appl. No. 11/338,956 dated May 7, 2013; 11 pages.
USPTO Final Rejection for U.S. Appl. No. 11/338,956 dated Jul. 10, 2012; 10 pages.
USPTO Final Rejection for U.S. Appl. No. 11/338,956 dated Aug. 24, 2010; 10 pages.
USPTO Final Rejection for U.S. Appl. No. 11/338,956 dated Sep. 12, 2007; 7 pages.
USPTO Final Rejection for U.S. Appl. No. 11/338,956 dated Sep. 24, 2008; 9 pages.
USPTO Final Rejection for U.S. Appl. No. 11/338,956 dated Nov. 18, 2011; 9 pages.
USPTO Non-Final Rejection for U.S. Appl. No. 11/338,956 dated Jan. 14, 2013; 10 pages.
USPTO Non-Final Rejection for U.S. Appl. No. 11/338,956 dated Mar. 14, 2012; 9 pages.
USPTO Non-Final Rejection for U.S. Appl. No. 11/338,956 dated Mar. 25, 2010; 10 pages.
USPTO Non-Final Rejection for U.S. Appl. No. 11/338,956 dated Apr. 15, 2014; 10 pages.
USPTO Non-Final Rejection for U.S. Appl. No. 11/338,956 dated May 1, 2008; 6 pages.
USPTO Non-Final Rejection for U.S. Appl. No. 11/338,956 dated Jun. 27, 2007; 8 pages.
USPTO Non-Final Rejection for U.S. Appl. No. 11/338,956 dated Aug. 8, 2011; 6 pages.
USPTO Non-Final Rejection for U.S. Appl. No. 11/338,956 dated Aug. 27, 2013; 11 pages.
USPTO Non-Final Rejection for U.S. Appl. No. 11/338,956 dated Dec. 9, 2010; 7 pages.
USPTO Notice of Allowance for U.S. Appl. No. 11/338,956 dated Jul. 31, 2014; 7 pages.
Written Opinion of the International Searching Authority for International Application No. PCT/JP2005/000875 mailed Mar. 8, 2005; 4 pages.

* cited by examiner

SEMICONDUCTOR MEMORY DEVICE HAVING LOWERED BIT LINE RESISTANCE

CROSS-REFERENCE TO RELATED APPLICATIONS

This application is a divisional of U.S. patent application Ser. No. 11/338,956, filed on Jan. 24, 2006, entitled "Semiconductor Memory Device Having Lowered Bit Line Resistance," which is a continuation of international application No. PCT/JP2005/000875, filed Jan. 24, 2005, which are hereby incorporated herein by reference in their entirety.

BACKGROUND OF THE INVENTION

Field of the Invention

This invention generally relates to non-volatile memories and fabrication methods thereof, and more particularly, to a non-volatile memory having an ONO (Oxide Nitride Oxide) film and a fabrication method thereof.

Description of the Related Art

In recent years, development of non-volatile memories on which data is rewritable has been widespread. In the technical field of such non-volatile memories, development has been striving to downsize the memory cells and increase the memory capacity.

Floating-gate flash memories, non-volatile memories on which the charge is stored in the floating gate, are widely used. However, as the memory cell is downsized for high storage density, it becomes more difficult to design floating-gate flash memories because, as the memory cell of the floating-gate flash memory is downsized, the tunnel oxide film must necessarily be thinner. This is because thinner tunnel oxide film increases the leakage current flowing across the tunnel oxide film. In addition, there arises a reliability problem wherein the charge stored in the floating gate is discharged by a defect introduced into the tunnel oxide film.

To address the above-mentioned problems, there are flash memories that have an ONO (Oxide/Nitride/Oxide) film such as MONOS (Metal Oxide Nitride Oxide Silicon) type or SONOS (Silicon Oxide Nitride Oxide Silicon) type films. These are flash memories where the charge is stored in a silicon nitride film, called a trap layer, sandwiched between layers of the silicon oxide films. In this type of flash memory, the charge is stored in a silicon nitride film which is serving as an insulation film. Accordingly, even if there is a defect in the tunnel oxide film the trap layer is not discharged, unlike the floating-gate flash memory. Also, multi-level bits can be stored in the trap layer of one memory cell, advantageously increasing the storage capacity of the non-volatile memory.

FIGS. 1A through 1D describe a flash memory having a conventional ONO film and the fabrication method thereof (hereinafter, referred to as the conventional fabrication technique). FIGS. 1A through 1D are cross-sectional views of conventional flash memories which includes memory cells and peripheral circuit regions. A memory cell region is shown on the left side and a peripheral circuit region is shown on the right side.

In FIG. 1A, there is provided a p-type silicon semiconductor substrate 100. On the silicon substrate 100, there is provided a first silicon oxide layer 110 to serve as a tunnel oxide film, a silicon nitride layer 112 to serve as the trap layer, and another silicon oxide layer 114 to serve as a protection film for implantation. A photoresist 120 is then applied and, by using general photolithographic techniques, openings 140 are created in regions for forming the bit lines and forming source/drain regions in the memory cell region. Here, a reference numeral L11 denotes the width of the opening 140.

Next, referring to FIG. 1B, arsenic (As) ions, for example, are implanted into the bit line and the source/drain regions and thermal treatment is implemented to form an N-type low-resistance layer 150 for the bit line and the source/drain regions. Here, a reference numeral L12 denotes the width of the low-resistance layer 150. A channel region 156 corresponds to a region between a pair of source/drain regions 150.

Then, referring to FIG. 1C, the silicon oxide layer 114, which is a protection film, is removed and a second silicon oxide layer 116 is formed.

Next, referring to FIG. 1D, the second silicon oxide layer 116, the silicon nitride layer 112, and the first silicon oxide layer 110 provided in the peripheral circuit region are removed. Then, another silicon oxide layer 170, to serve as the gate oxide film, is formed in the region forming the peripheral circuit. In addition, there is provided a gate metal 182 in the peripheral circuit, a control gate in the memory cell, and a polysilicon layer in the memory cell region to serve as a word line 180. Subsequently, the memory cells and the peripheral circuit are fabricated in accordance with commonly used fabrication methods and, thus, flash memory having an ONO film is completed.

Also, in order to reduce the resistance value of the bit line, Japanese Patent Application Publication No. 2002-170891 (hereinafter, referred to as Patent Document 1) discloses a flash memory having an ONO film in which a silicided metal layer is included in a portion of the bit line.

In the conventional fabrication technique, it was difficult to downsize the low-resistance layer 150, which is the bit line as well as the source/drain region having the size of L12. The size L12 is greater than the size L11 of the opening 140 by an amount of lateral diffusion due to the ion implantation. The size L11 of the opening 140 has limitations up to approximately half the wavelength of a photolithography machine. For example, if a commonly used KrF photolithography machine is employed, it is difficult to make the size L11 equal to or narrower than 100 nm. Accordingly, it is also difficult to make the size L12 equal to or narrower than 100 nm. As the size L12 of the low-resistance layer 150 of the bit line and the source/drain region is downsized, the resistance of the bit line is increased, causing a problem of degrading the program and erase characteristics.

To address the aforementioned problem, as described in Patent Document 1, there is a conventional technique of forming the first low-resistance layer and the second low-resistance layer. The first low-resistance layer is formed by implanting ions into the bit line and the second low-resistance layer of low-resistance silicided metal film is thereafter formed partially on the first low-resistance layer. However, with the technique disclosed in Patent Document 1, the second low-resistance layer cannot successively be formed in a current flowing direction, therefore not sufficiently lowering the resistance of the bit line. In addition, the silicided metal film is provided between the sidewall control gates. Thus, unless the width of the bit line is increased, the silicided metal film cannot be formed on the low-resistance layer. This conventional technique is therefore not compatible with the demand for downsizing. Furthermore, unless there are provided two polysilicon layers, the memory cell cannot be completed. Since, generally, the gate in the peripheral circuit region is formed with a single layer of polysilicon film, the structure having two layers of polysilicon films in the memory cell causes the fabrication process of the peripheral circuit to become quite complicated.

On the other hand, in the conventional fabrication technique, it is difficult to further deposit a low-resistance layer on the bit line region 150, because the photoresist is used as the mask. At least 200° C. is necessary for forming the low-resistance layer, in general, and such temperatures exceed a glass-transition temperature of the photoresist.

SUMMARY OF THE INVENTION

The present invention has been made in view of the above circumstances and provides a semiconductor device and fabrication method thereof, which can prevent an increase in the bit line resistance as the memory cell is downsized, and, additionally, has simple fabrication processes for the peripheral circuit.

In accordance with an aspect of the present invention, preferably, there is provided a semiconductor device including a semiconductor substrate; an ONO (oxide/nitride/oxide) film provided on the semiconductor substrate; a control gate provided on the ONO film; and a bit line having a first low-resistance layer formed in the semiconductor substrate and a second low-resistance layer that is in contact with the first low-resistance layer and runs in a direction in which a current flows through the bit line, the second low-resistance layer having a sheet resistance lower than the first low-resistance layer.

In accordance with the present invention, it is possible to lower the bit line resistance by providing second low-resistance layers having low sheet resistance in the bit line successively. This reduces the size of the bit line and downsizes the semiconductor device.

The first low-resistance layer of the aforementioned semiconductor device is an impurity diffused layer. In accordance with the present invention, the impurity diffused layer used for the first low-resistance layer can simplify the fabrication processes.

The second low-resistance layer of the aforementioned semiconductor device includes a silicided metal layer. In accordance with the present invention, it is possible to provide the semiconductor device having a low-resistance bit line with the low-resistant silicided metal layer used for the bit line.

In accordance with another aspect of the present invention, it is possible to provide the aforementioned semiconductor device wherein the second low-resistance layer includes a silicon layer epitaxially grown, the aforementioned semiconductor device having a low-resistance bit line with the epitaxially grown silicon layer used for the bit line.

The aforementioned semiconductor device may further include a word line connected to the control gate, wherein the control gate and the word line are integrally formed by a single polysilicon layer. Thus, in accordance with the present invention, the memory cell can be formed with a single polysilicon film. It is therefore possible to provide a semiconductor device in accordance with the present invention that simplifies the fabrication process of the peripheral circuit with the polysilicon film used for the gate metal in the peripheral circuit.

In accordance with yet another aspect of the present invention, the bit line and the control gate are isolated by only an upper oxide film of the ONO film. Thus, the control gate and the bit line are isolated by a silicon oxide layer of excellent quality. It is therefore possible to provide a semiconductor device having excellent isolation, with a simple configuration.

According to another aspect of the present invention, preferably, there is provided a method of fabricating a semiconductor device including forming an ONO film on a semiconductor substrate; forming, on the ONO film, an insulator mask layer having an opening corresponding to a bit line formation region; selectively implanting an impurity ion in the semiconductor substrate with the insulator mask layer so as to form a first low-resistance layer; etching the ONO film in the bit line formation region; and forming a second low-resistance layer that is in contact with the first low-resistance layer in the bit line formation region and runs in a direction in which a current flows, the second low-resistance layer having a sheet resistance lower than the first low-resistance layer.

In accordance with the present invention, the second low-resistant layer having the low sheet resistance on the bit line reduces the bit line resistance. It is thus possible to reduce the size of the bit line resistance and provide a semiconductor fabrication method for downsizing.

Also in accordance with the present invention, the step of forming the insulator mask layer on the aforementioned semiconductor device comprises forming a spacer on a sidewall of the opening so that the opening is reduced. Thus, it is possible to provide a fabrication process for a semiconductor device in which the bit line can be further downsized.

In addition, the insulator mask layer on the aforementioned semiconductor device is a silicon nitride layer, thus retaining the etch selectivity with the upper oxide film of the ONO film and making it possible to provide a simplified fabrication method for a semiconductor device in accordance with the present invention.

Fabrication of the aforementioned semiconductor device may further include removing an upper oxide layer of the ONO film prior to forming the second low-resistance layer, and forming a silicon oxide layer on an exposed nitride layer of the ONO film and the second low-resistance layer exposed through the opening.

According to the present invention, the control gate and the bit line of the aforementioned semiconductor device is isolated by a silicon oxide layer having excellent quality. It is thus possible to provide a fabrication method for the semiconductor device having excellent isolation with a simple configuration.

In accordance with the present invention, the step of forming the first low-resistance layer of the aforementioned semiconductor device may comprise selectively removing an upper oxide layer of the ONO film and an underlying nitride layer thereof in the bit line formation region before the impurity ion is implanted.

Further, in accordance with the present invention, the process for forming the first low-resistance layer is implemented by ion implantation through the first oxide silicon film. It is therefore possible to reduce the lateral diffusion of the implanted ions and provide a fabrication method of a further downsized semiconductor device.

In regards to the aforementioned semiconductor device, the step of forming the second low-resistance layer may comprise forming a silicided metal layer. Thus in accordance with the present invention, the low-resistance silicided metal used for the bit line makes it possible to provide a fabrication method for a semiconductor device having low resistance.

Formation of the aforementioned semiconductor device may further include selectively providing resin on the silicided metal layer and, thereafter, removing the insulator mask layer. Thus, in accordance with the present invention, it is possible to provide a fabrication method for a semiconductor device that prevents the nitride film of the ONO film from being removed when the insulator mask layer is removed.

In addition, the step of forming the second low-resistance layer may comprise epitaxially growing a low-resistance silicon layer. Therefore, it is possible to provide a fabrication method of a semiconductor device having low-resistant bit line in accordance with the present invention by providing an epitaxially grown silicon layer having a low resistance for the bit line.

Thus, in accordance with the present invention, it is possible to provide a semiconductor device and fabrication method thereof which can prevent the increase of the bit line resistance and downsize the memory cell, while having simple fabrication processes for formation of the peripheral circuit.

DESCRIPTION OF THE PREFERRED EMBODIMENTS

A description will now be given, with reference to the accompanying drawings, of embodiments of the present invention.

First Embodiment

A description will be given of a first embodiment with reference to FIGS. 2A through 2D, FIGS. 3A through 3D, and FIGS. 4A through 4C. The first embodiment of the present invention exemplifies a silicided metal layer or metal silicide layer used for a second low-resistance layer. The aforementioned drawings are cross-sectional views of a memory cell region shown on the left side and a peripheral circuit region shown on the right side in accordance with the first embodiment of the present invention.

Figure 1A:
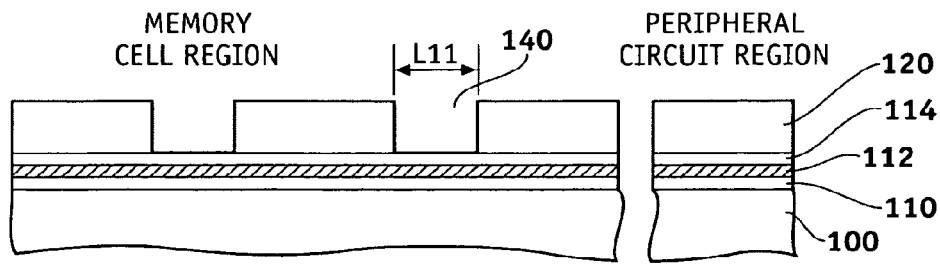
FIGS. 1A through 1D are cross-sectional views of a conventional flash memory having an ONO film in accordance with the conventional fabrication technique and a fabrication method thereof.
Figure 1B:
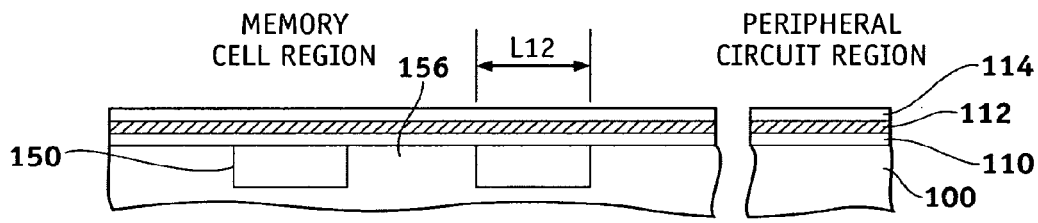
Figure 1C:
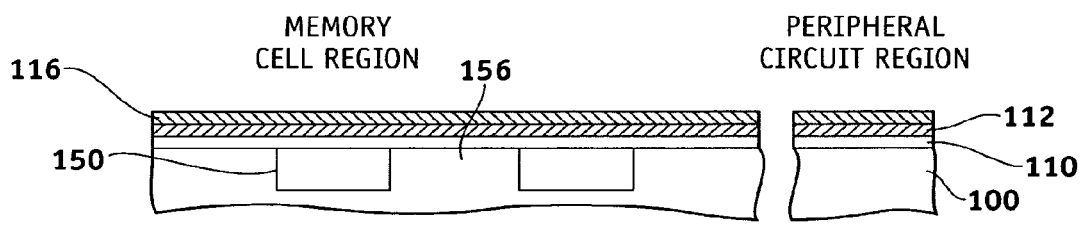
Figure 1D:
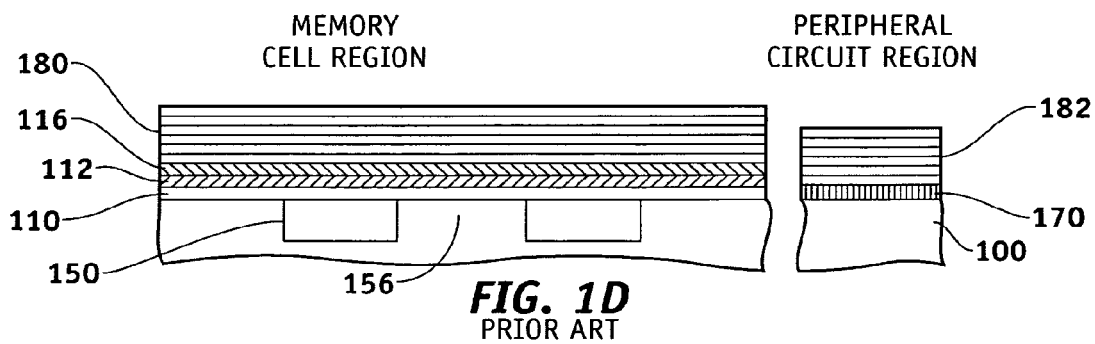
Figure 2A:
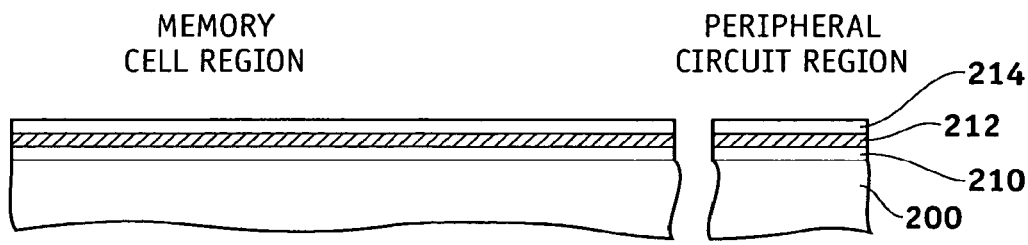
FIGS. 2A through 2D are cross-sectional views of a flash memory having an ONO film in accordance with a first embodiment of the present invention and a fabrication method thereof.

Referring to FIG. 2A, there is provided a P-type silicon semiconductor substrate 200. On the p-type silicon semiconductor substrate 200, a first silicon oxide layer 210 as a tunnel oxide layer and a silicon nitride layer 212 as a trap layer are successively formed by a general fabrication method. Here, the first silicon oxide layer 210 is deposited by, for example, a method of thermal oxidization. The silicon nitride layer 212 is deposited by, for example, a method of chemical vapor deposition (CVD). Additionally, a third silicon oxide layer 214 is formed to serve as a protection layer that protects the trap layer during the fabrication process. Here, the third silicon oxide layer is deposited at least 10 nm thick by a HTO (High Temperature Oxide) method or a CVD method with the use of TEOS (tetraethylorthosilicate).

Figure 2B:
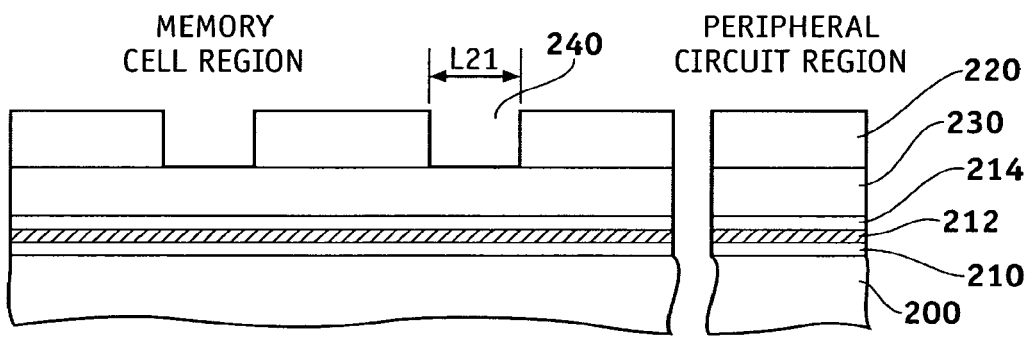

Next, referring to FIG. 2B, an insulator mask layer 230 is formed to be used as a mask for forming the bit line and the source/drain region. Here, the insulator mask layer 230 is preferably a silicon nitride film formed by the CVD method, and the thickness thereof is configured to be sufficient for blocking implanted ions, as will be described later. Using silicon nitride film, it is easy to remove the insulator mask layer 230 in a later process while, when the insulator mask layer 230 is removed, retaining the selectivity relative to the third silicon oxide layer 214.

Subsequently, a photoresist 220 is applied to the insulator mask layer 230 and an opening 240 is formed at the bit line and the source/drain region in accordance with a normally used exposure process. At this point, the opening 240 has an opening size L21. An antireflection film, not shown, is formed below the photoresist 220, enabling a narrower opening.

Figure 2C:
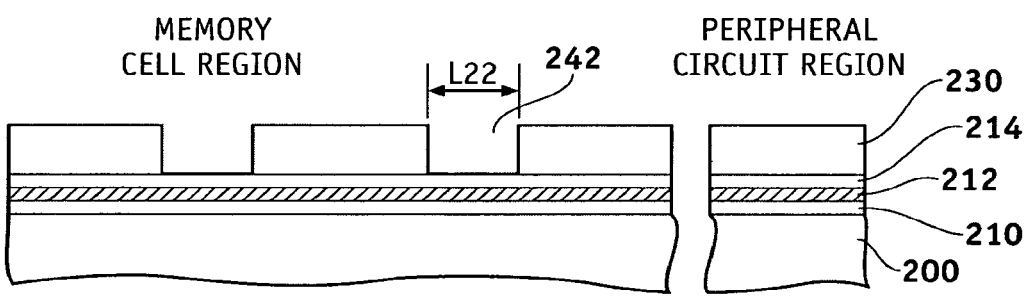

Next, referring to FIG. 2C, the insulator mask layer 230 is selectively etched with the photoresist 220 as the mask, and openings 242 are created in the insulator mask layer 230. The opening 242 has an opening size L22, which is almost equal to the opening size L21. Then, the photoresist 220 is removed in an ashing process.

Figure 2D:
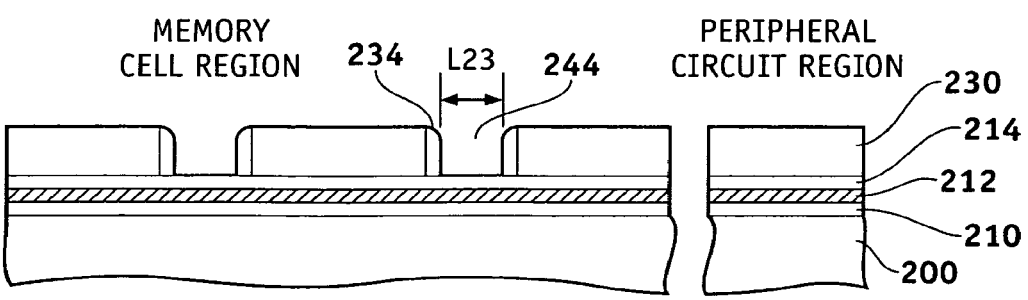

Then, referring to FIG. 2D, a spacer insulation film, not shown, is formed to cover an upper surface of the insulator mask layer 230, side faces of the openings 242 in the insulator mask layer, and the surface of the third silicon oxide layer below the openings 242. Preferably, the spacer insulation film has the same composition as that of the insulator mask layer 230. For example, a silicon nitride film formed by a CVD method may be used. The thickness depends on how much the size of the opening 242 in the insulator mask layer is reduced. By employing the silicon nitride film, it is easy to remove spacers 234 in a later process, and when removed, it is also possible to retain the selectivity for the third silicon oxide layer 214.

Subsequently, the spacer insulation film is etched back to leave the spacers 234 on side faces of the openings 242, and openings 244 having an opening size L23 are created. The spacers 234 may not necessarily be used in the present invention, yet with the spacers 234 the opening 244 can be formed to be narrower than the opening size L21 of the opening 240 of the photoresist, allowing further downsizing of the bit line.

Figure 3A:
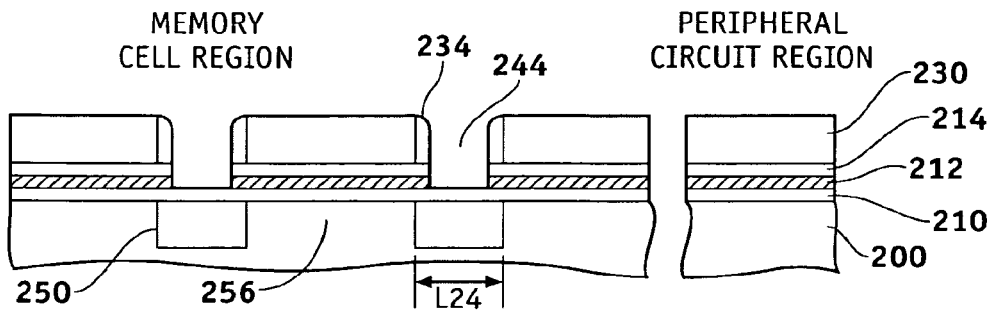
FIGS. 3A through 3D are cross-sectional views of the flash memory having the ONO film in accordance with the first embodiment of the present invention and the fabrication method thereof.

Next, referring to FIG. 3A, the third silicon oxide layer 214 and the silicon nitride layer 212 are selectively etched with the openings 244 used as the mask. For instance, arsenic (As) ions are implanted and thermally treated to provide a first low-resistance layer 250 in the N-type bit line region as well as the source/drain region. At this point, the first low-resistance layer 250 has a size L24. A channel region 256 is interposed by the first low-resistance layers 250 which are source/drain regions.

By etching the third silicon oxide layer 214 and the silicon nitride layer 212, the implanted ions can pass through only the first silicon oxide layer 210. This makes it possible to lower the energy of ion implantation and suppress the lateral diffusion of the ions, thereby enabling provision of a thinner bit line. Generally known pocket implantation may be used in the aforementioned implantation process.

Figure 3B:
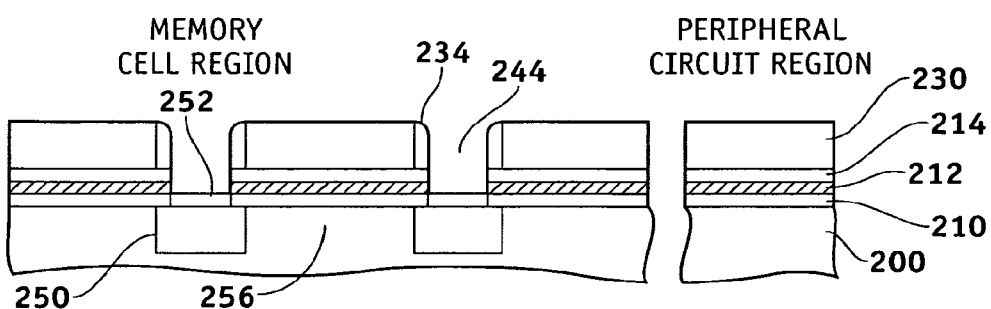

Referring next to FIG. 3B, the first silicon oxide layer 210 in the opening 244 is etched. Then, a silicided metal layer 252 is formed as a second low-resistance layer on the bit line region and the source/drain region in the openings 244. As a silicided metal, for example, cobalt (Co) is deposited on the silicon substrate in the openings 244 by sputtering and thermally treated by a Rapid Thermal Anneal (RTA) method so as to provide cobalt silicide. The openings 244 are formed with the use of the insulator mask layer 230 of insulation film and the spacers 234 as the mask. Therefore, the formation process of the silicided metal film can be implemented at high temperatures.

Figure 3C:
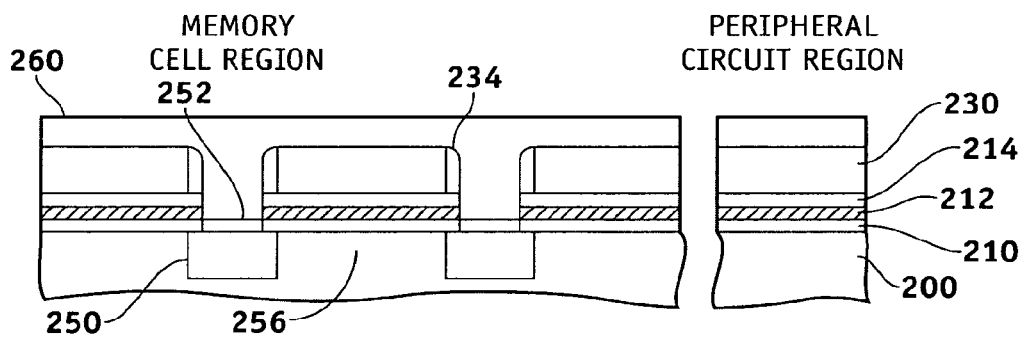

Next, referring to FIG. 3C, a resin 260 is applied to cover the upper surface of the insulator mask layer 230, the side faces of the openings 244, and the surface of the silicided metal layer 252 below the openings 244. For instance, HSQ (Hydrogen-silsesquioxane) is employed for the resin.

Figure 3D:
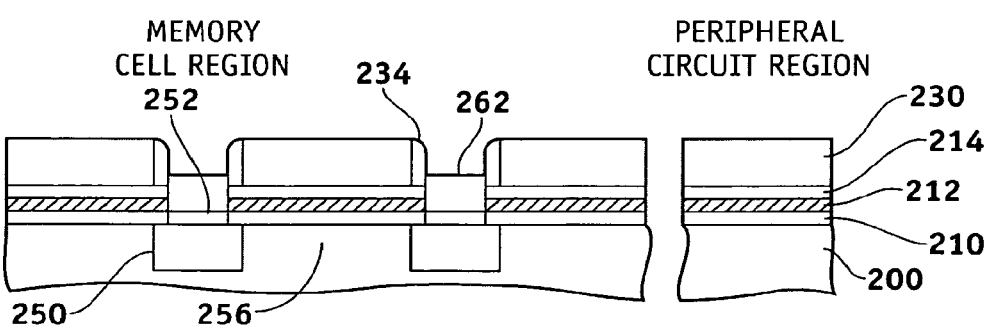

Then, referring to FIG. 3D, the resin 260 is removed by an ashing process, for example, to leave buried regions 262 of resin in the openings 244. In accordance with the present invention, preferably, the buried regions 262 are left higher than a top of the third silicon layer 214.

Figure 4A:
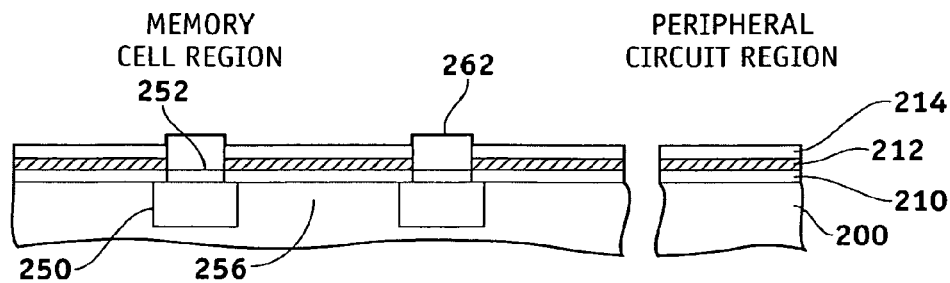
FIGS. 4A through 4C are cross-sectional views of the flash memory having the ONO film in accordance with the first embodiment of the present invention and the fabrication method thereof.

Then, referring to FIG. 4A, the insulator mask layer 230 and the spacers 234 are removed by hot phosphoric acid. The resin remaining portion 262 protects the side faces of the silicon nitride layer 212 facing the openings 244 during removal of the insulator mask layer 230. Hence, the insulator mask layer 230 and the spacers 234 can be removed without removing the silicon nitride layer 212.

Figure 4B:
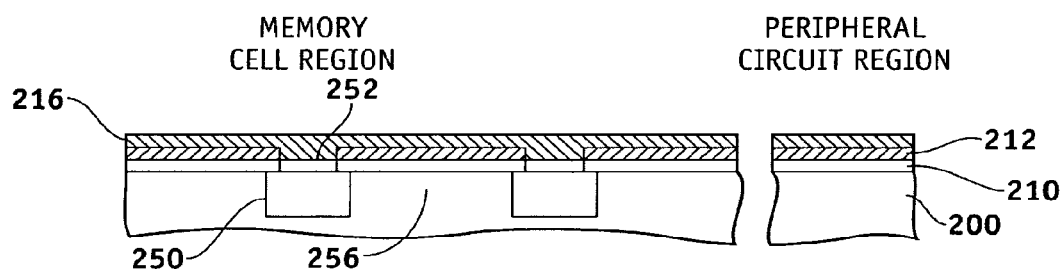

Referring to FIG. 4B, the buried regions 262 of resin are removed, for example, in an ashing process, and the third silicon oxide layer 214 is removed by, for example, buffered hydrofluoric acid. Then, a second silicon oxide layer 216 is formed on the surface of the silicon nitride layer 212 and on the surface of the silicided metal layer 252 as a top oxide layer by the CVD method, for example. It is preferable that the formation temperature is at most 800° C. to prevent oxidization of the silicided metal layer. It is therefore possible to isolate the silicided metal layer 252 which is the bit line and a control gate 280 with the use of the second silicon oxide layer, thereby providing excellent film quality without being exposed to ions. This allows excellent isolation.

Figure 4C:
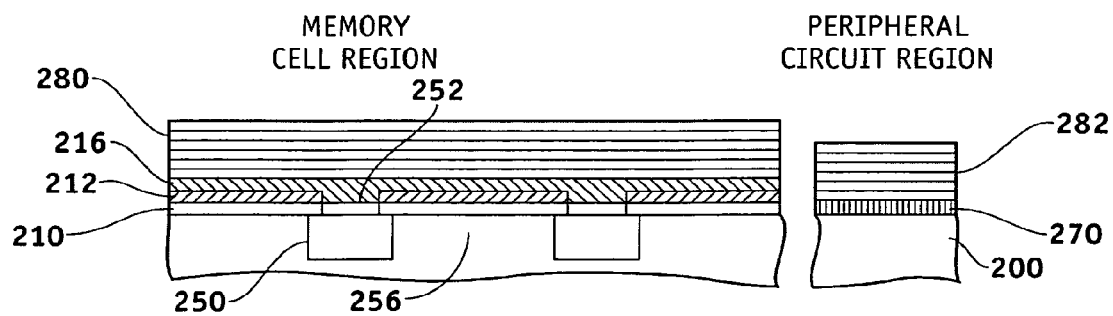

Lastly, referring to FIG. 4C, the second silicon oxide layer 216, the silicon nitride layer 212, and the first silicon oxide layer 210 are selectively removed in the peripheral circuit region. A fourth silicon oxide layer 270 is formed as the gate oxide film in the peripheral circuit region. A polysilicon layer is deposited on the surface of the fourth silicon oxide layer 270 in the peripheral circuit region and on the surface of the second oxide silicon layer in the memory cell region. The polysilicon layer serves as the control gate as well as the word line 280 in the memory cell region and serves as a gate electrode 282 in the peripheral circuit region. Then, after the general fabrication processes, the memory cells and the peripheral circuits are fabricated and the flash memory is produced in accordance with the first embodiment of the present invention.

In accordance with the first embodiment of the present invention, the size L24 of the first low-resistance layer 250 in the bit line region is greater than the size L23 of the opening 244 in the spacer by an amount of lateral diffusion of the implanted ions. However, the size L23 of the opening 244 in the spacer can be narrower than the size L21 of the opening in the photoresist by approximately the size of the spacer. Accordingly, even by using the commonly used KrF photolithography machine, the size of the opening can be created equal to or narrower than 100 nm. The openings 244 are formed with the insulation film used as the mask. Therefore, it is possible to form the silicided metal layer 252 in a high-temperature process that exceeds the glass-transition temperature. This prevents an increase in the bit line resistance, allowing downsizing of the bit line easily. The memory cell includes a single polysilicon layer, which can also be used as the gate electrode in the peripheral circuit, making it possible to facilitate the fabrication process of the peripheral circuit.

Second Embodiment

Referring to FIGS. 5A through 5D, a description will be given of a second embodiment of the present invention. The second embodiment of the present invention exemplifies an epitaxially grown low-resistance silicon layer employed for the second low-resistance layer. FIGS. 5A through 5D are cross-sectional views of the second embodiment of the present invention. The memory cell region is shown on the left side and the peripheral circuit region is shown on the right side.

Figure 5A:
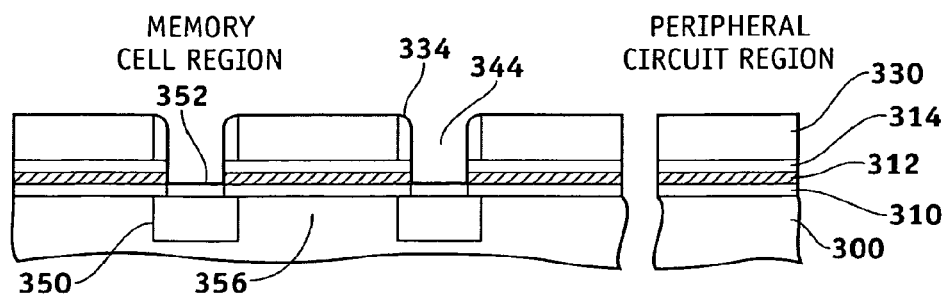
FIGS. 5A through 5D are cross-sectional views of the flash memory having the ONO film in accordance with a second embodiment of the present invention and a fabrication method thereof.

FIG. 5A corresponds to FIG. 3A in accordance with the first embodiment of the present invention. The fabrication processes are the same as shown in FIGS. 2A through 2D and FIG. 3A. At this point, a reference numeral 300 denotes the silicon substrate, a reference numeral 310 denotes the first silicon oxide tunnel oxide layer, a reference numeral 312 denotes the silicon nitride trap layer, a reference numeral 314 denotes the third silicon oxide layer of protection film, a reference numeral 330 denotes the insulator mask layer, a reference numeral 334 denotes the spacers, a reference numeral 344 denotes the opening for forming the bit line and the source/drain region, a reference numeral 350 denotes the first low-resistance layer that forms the N-type bit line and the source/drain region formed by ion implantation, and a reference numeral 356 denotes the channel region between the source/drain regions 350.

Figure 5B:
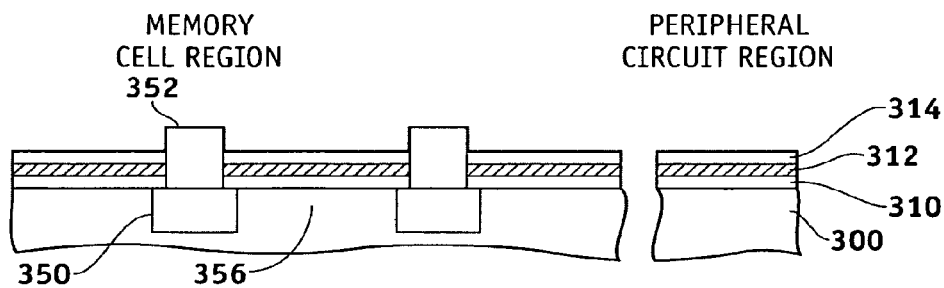

Next, referring to FIG. 5B, a second low-resistance layer 352, which is doped with arsenic (As) or phosphorous (P), is epitaxially grown on the first low-resistance layer below the openings 344. Using selective epitaxial growth, the second low-resistance layer is not deposited on the insulator mask layer 330 of insulation film or on the spacers 334. At this point, the second low-resistance layer 352 is formed to be higher than a top of the third silicon oxide layer 314. The insulator mask layer 330 and the spacers 334 are then removed by hot phosphoric acid and the side faces of the openings 344 are covered with the second low-resistance layer 352. Therefore, when the insulator mask layer 330 and the spacers 334 are removed, the silicon nitride layer 312 is not removed. Accordingly, even if the buried regions 262 in accordance with the first embodiment are not provided in the second embodiment of the present invention, the insulator mask layer 330 and the spacers 334 can be readily removed.

Figure 5C:
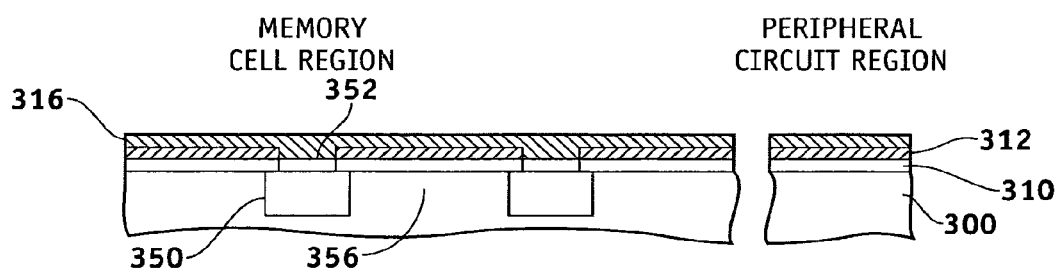

Referring next to FIG. 5C, the third silicon oxide protection layer 314 is removed by, for example, buffered hydrofluoric acid and the top of the second low-resistance layer 352 is etched to be approximately equal in thickness to the first silicon oxide layer 310. Then, the second silicon oxide layer 316 is deposited as the top oxide film.

Figure 5D:
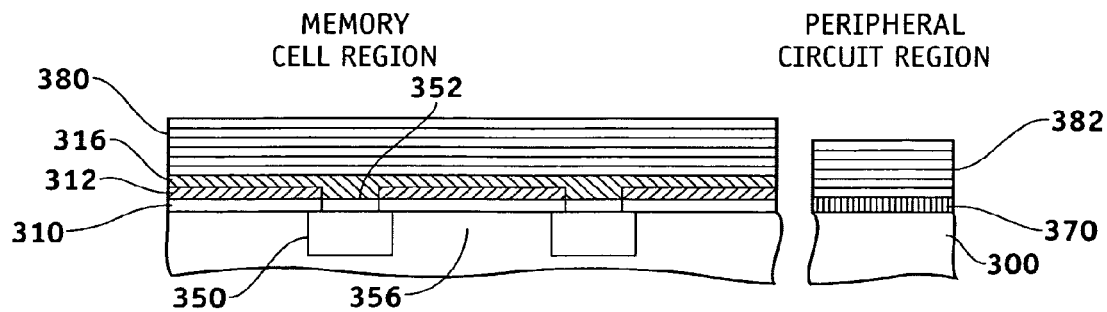

Lastly, referring to FIG. 5D, the flash memory in accordance with the second embodiment of the presentation is completed by implementing the same fabrication processes as shown in FIG. 4C in accordance with the first embodiment of the present invention. Here, a reference numeral 370 denotes a fourth oxide silicon layer of gate oxide film in the peripheral circuit region, a reference numeral 380 denotes the control gate and word line in the memory cell region, and a reference numeral 382 denotes the gate electrode in the peripheral circuit region.

With the second low-resistance layer 352 in accordance with the second embodiment, it is possible to lower the resistance of the bit line, downsize the bit line, and fabricate the peripheral circuit readily, as in the first embodiment. Use of the resin 260 provided in the first embodiment is not necessary in the second embodiment, yet there is the advantage that the insulator mask layer 330 and the spacers 334 can be removed easily.

Although preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating a semiconductor device comprising:
    forming an oxide/nitride/oxide (ONO) film on a semiconductor substrate;
    forming, on the ONO film, an insulator mask layer having an opening corresponding to a bit line formation region;
    selectively implanting an impurity ion in the semiconductor substrate with the insulator mask layer so as to form a first low-resistance layer;
    etching the ONO film in the bit line formation region; and
    forming a second low-resistance layer in contact with the first low-resistance layer in the bit line formation region and running in a direction in which a current flows, the second low-resistance layer having a sheet resistance lower than the first low-resistance layer, and the second low-resistance layer having a top surface coplanar with a top surface of an oxide layer of the ONO film.

2. The method as claimed in claim 1, wherein the step of forming the insulator mask layer comprises forming a space on a sidewall of the opening so that the opening is reduced.

3. The method as claimed in claim 1, wherein the step of forming the insulator mask layer comprises the step of forming a silicon nitride layer as the insulator mask layer.

4. The method as claimed in claim 1, further comprising:
    removing an upper oxide layer of the ONO film prior to forming the second low-resistance layer; and
    forming a silicon oxide layer on an exposed nitride layer of the ONO film and the second low-resistance layer exposed through the opening.

5. The method as claimed in claim 1, wherein the step of forming the first low-resistance layer comprises selectively removing an upper oxide layer of the ONO film and an underlying nitride layer thereof in the bit line formation region before the impurity ion is implanted.

6. The method as claimed in claim 1, wherein the step of forming the second low-resistance layer comprises forming a silicided metal layer.

7. The method as claimed in claim 6, further comprising:
    selectively providing resin on the silicided metal layer; and removing the insulator mask.

8. The method as claimed in claim 1, wherein the step of forming the second low-resistance layer comprises epitaxially growing a low-resistance silicon layer.

9. The method as claimed in claim 1, wherein the step of forming the second low-resistance layer comprises forming the second low-resistance layer to a particular thickness for the top surface of the second low-resistance layer to be coplanar with the top surface of the oxide layer of the ONO film.

10. The method as claimed in claim 1, wherein the step of forming the second low-resistance layer comprises:
    epitaxially growing the second low-resistance layer to be higher than the top surface of the oxide layer of the ONO film; and
    etching the second low-resistance layer to a particular thickness for the top surface of the second low-resistance layer to be coplanar with the top surface of the oxide layer of the ONO film.

* * * * *